(12) United States Patent
Heuberger et al.

(10) Patent No.: US 9,832,920 B2
(45) Date of Patent: Nov. 28, 2017

(54) METHOD FOR EQUIPPING PRINTED CIRCUIT BOARDS

(71) Applicant: ASM Assembly Systems GmbH & Co. KG, Munich (DE)

(72) Inventors: Franz Heuberger, Heidelberg (DE); Rudolf Kiener, Geretsried (DE); Christian Meissner, Bad Aibling (DE)

(73) Assignee: ASM ASSEMBLY SYSTEMS GMBH & CO. KG (DE)

( * ) Notice: Subject to any disclaimer, the term of this patent is extended or adjusted under 35 U.S.C. 154(b) by 250 days.

(21) Appl. No.: 14/932,152

(22) Filed: Nov. 4, 2015

(65) Prior Publication Data

US 2016/0143197 A1    May 19, 2016

(30) Foreign Application Priority Data

Nov. 18, 2014  (DE) .................. 10 2014 116 879

(51) Int. Cl.
| | |
|---|---|
| *H05K 3/30* | (2006.01) |
| *H05K 13/04* | (2006.01) |
| *H05K 13/00* | (2006.01) |
| *H05K 13/08* | (2006.01) |

(52) U.S. Cl.
CPC .......... *H05K 13/0495* (2013.01); *H05K 3/30* (2013.01); *H05K 13/0015* (2013.01); *H05K 13/0061* (2013.01); *H05K 13/08* (2013.01); *Y10T 29/49124* (2015.01); *Y10T 29/49131* (2015.01)

(58) Field of Classification Search
CPC ............ H05K 13/0069; H05K 13/0495; Y10T 29/53174; Y10T 29/4913; Y10T 29/53091; Y10T 29/53265; Y10T 29/49004; Y10T 29/5196; Y10T 29/53; Y10T 29/49826

USPC ......... 29/832, 33 P, 705, 711, 721, 825, 829
See application file for complete search history.

(56) References Cited

U.S. PATENT DOCUMENTS

| | | | | |
|---|---|---|---|---|
| 6,032,577 | A * | 3/2000 | Doyle | B41F 15/0881 101/129 |
| 6,983,532 | B2 * | 1/2006 | White | H05K 13/08 29/33 P |
| 7,318,516 | B2 * | 1/2008 | Tani | H05K 13/0061 198/339.1 |

FOREIGN PATENT DOCUMENTS

| | | |
|---|---|---|
| EP | 1 555 502 | 7/2005 |
| EP | 1 863 330 | 12/2007 |

* cited by examiner

*Primary Examiner* — Thiem Phan
(74) *Attorney, Agent, or Firm* — Ostrolenk Faber LLP

(57) ABSTRACT

A method for equipping printed circuit boards on an equipping machine, the printed circuit boards being of a first length, and the equipping machine being realized to equip printed circuit boards of a second length, the second length being more than twice as great as the first length. The equipping machine has an input section (1) and an equipping section (2), the equipping section (2) being disposed after the input section (1) in a direction of conveyance (F) of the printed circuit boards, disposed after the input section (1) in a direction of conveyance of the printed circuit boards, the printed circuit boards of the first length and the printed circuit boards of the second length being transportable, in their longitudinal direction, from the input section (1) into the equipping station (2).

10 Claims, 2 Drawing Sheets

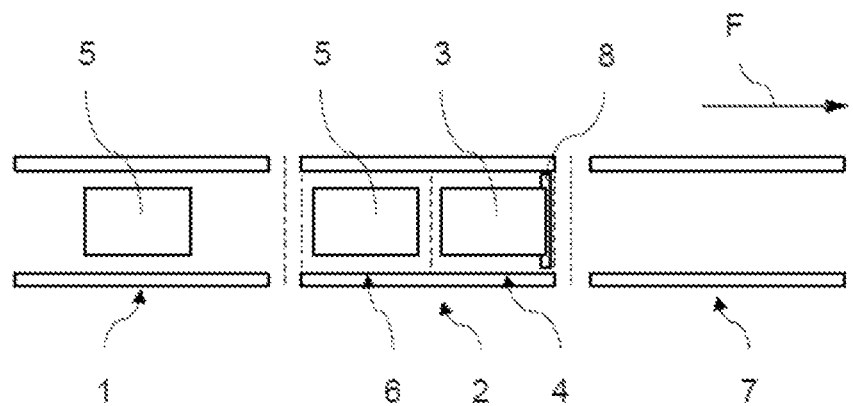
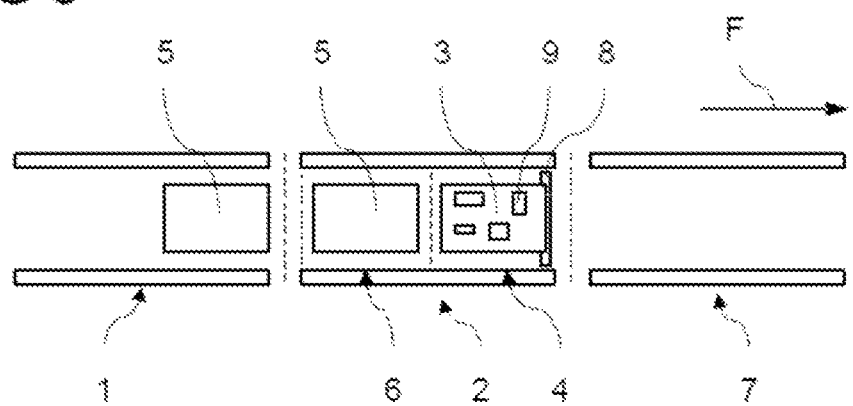
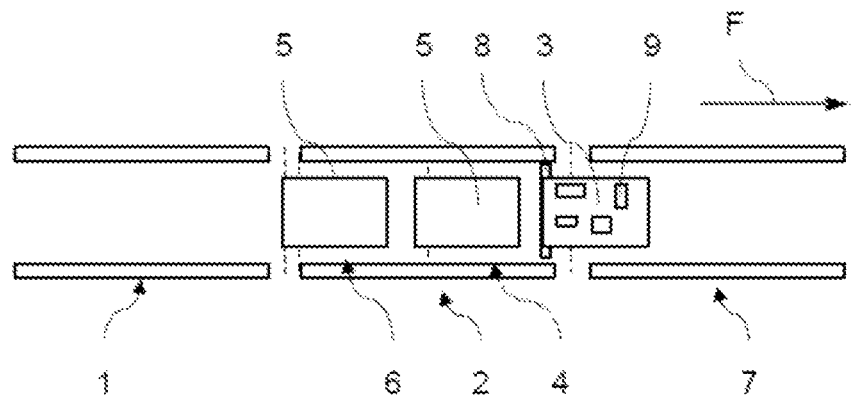

METHOD FOR EQUIPPING PRINTED CIRCUIT BOARDS

CROSS REFERENCE TO RELATED APPLICATIONS

The present application claims benefit of German application no. 10 2014 116 879.8, filed on Nov. 18, 2014, the entire contents of which are incorporated herein by reference.

TECHNICAL FIELD OF THE INVENTION

The present invention relates to a method for equipping printed circuit boards of a first length on an equipping machine, the equipping machine being realized to equip printed circuit boards of a second length. In this case, the second length is more than twice as great as the first length. The equipping machine has an input section and an equipping station, the equipping station being disposed after the input section in a direction of conveyance of the printed circuit boards. The printed circuit boards of the first length and the printed circuit boards of the second length are transportable, in the direction of conveyance, from the input section into the equipping station.

BACKGROUND OF THE INVENTION

It is known that, on an equipping machine, printed circuit boards are equipped with electronic components such as, for example, resistors, capacitors, diodes. For this purpose, conventional equipping machines have a conveying means, by means of which a printed circuit board can be transported, along its longitudinal direction, from an input section to an equipping post of an equipping section. At the equipping post, the printed circuit board is positioned precisely and fixed temporarily, at least for the duration of the equipping operation. In the equipping operation, electronic components provided from a stock are taken from the stock by an equipping unit and disposed on the printed circuit board. After the equipping operation, the fixing of the printed circuit board is removed, the printed circuit board is transported out of the equipping section, and a subsequent printed circuit board is transported from the input section to the equipping post. The time required for transporting this unequipped printed circuit board to the equipping post is also referred to as changeover time.

In a subsequent process after the equipping operation, the electronic components are fixed to the printed circuit board, e.g. by soldering, in such a manner that the electronic component is electrically connected to the printed circuit board. Conventional equipping machines are realized to equip differing printed circuit boards of differing dimensions, such as, for example, width and/or length. A maximum length of a printed circuit board that can be equipped on an equipping machine is defined in this case by a length of the input section and of the equipping section of the equipping machine. In the case of printed circuit boards of a length that is less than half of the maximum length printed circuit board that can be equipped on the equipping machine, there is the problem that, following the removal of the equipped printed circuit board for the next printed circuit board to be equipped, it is necessary to travel a transport path, between the input section and the equipping post, that is at least twice the length of the corresponding printed circuit board, the transport path ideally corresponding to the length of the printed circuit board. Owing to this transport path that is relatively long in relation to the length of the printed circuit board, the changeover time of the printed circuit boards is greater than in the ideal case. As a result of this, production capacity of the equipping machine is significantly reduced.

Known from the EP patent application 1 863 330 is an equipping machine having a transport system that is realized to receive and temporarily store a group of printed circuit boards on a storage means. A storage means, loaded with a group of printed circuit board, can be moved in an equipping region of the equipping machine for the purpose of equipping. Such a transport system has the disadvantage that only with large investment costs can it be implemented in a conventional equipping machine. Furthermore, an equipping means of the equipping machine is inactive for the duration of receiving the individual printed circuit boards on the storage means, such that this results in relatively long dead times between completion of the equipping of printed circuit boards of one group and the start of equipping of printed circuit boards of a subsequent group.

An equipping machine for printed circuit boards, having a transport system, is known from the EP patent 1 535 502. The equipping machine has an input section, an equipping section and an output section. A sensor arrangement is intended to ensure that transport of a printed circuit board that has just been equipped, from the equipping section into the output section, is effected at the same time as transport of an unequipped printed circuit board from the input section into the equipping section. The patent EP 1 535 502 does not deal with the problem of how printed circuit boards of differing length are to be transported within the equipping machine. Furthermore, such an equipping machine requires a multiplicity of additional sensors, such that retrofitting of a conventional equipping machine with these sensors requires high investment costs.

SUMMARY OF THE INVENTION

It is therefore the object of the present invention to remedy the disadvantages, described above, of a known equipping machine, at least partially. In particular, it is the object of the present invention to provide a method for equipping printed circuit boards of a first length on an equipping machine for equipping printed circuit boards of a second length, the first length being less than half of the second length, which method has shorter changeover times for the printed circuit boards, in comparison with conventional methods.

The above object is achieved by a method having the features of Claim 1. Further features and details of the invention are given by the dependent claims, the description and the drawings.

According to a first aspect of the invention, the object is achieved for a method for equipping printed circuit boards on an equipping machine, the printed circuit boards being of a first length and the equipping machine being realized to equip printed circuit boards of a second length, the second length being more than twice as great as the first length. The equipping machine has an input section and an equipping section, the equipping section being disposed after the input section in a direction of conveyance of the printed circuit boards, the printed circuit boards of the first length and the printed circuit boards of the second length being transportable, in their longitudinal direction, from the input section into the equipping station. The method has the following method steps:

transporting a first printed circuit board of first length out of the input section and into the equipping section;

disposing the first printed circuit board on an equipping post of the equipping section;

transporting at least one second printed circuit board of first length out of the input section and into a buffer region of the equipping section, the buffer region being disposed between the equipping post and the input section;

fixing the first printed circuit board to the equipping post in a releasable manner;

equipping the first printed circuit board;

releasing the fixing of the first printed circuit board;

transporting the first printed circuit board out of the equipping section; and transporting a second printed circuit board, which is disposed adjacently to the equipping post, out of the buffer region and on to the equipping post.

Printed circuit boards used in the method have a length, a width and a thickness, the length of the printed circuit boards extending, by definition, parallelwise in relation to a direction of transport of the printed circuit boards. The first printed circuit board and the second printed circuit boards are preferably realized identically. A distinction between a first printed circuit board and second printed circuit boards serves merely to aid understanding of the invention.

Execution of the method according to the invention requires at least one equipping machine, or automatic equipping machine, that is realized to equip printed circuit boards of a second length. The second length is a maximum length that a printed circuit board may have to enable it to be equipped by the equipping machine. The second length is determined substantially by a length of the equipping section.

Furthermore, execution of the method according to the invention requires printed circuit boards that have a first length, the first length being less than half of the second length, such that, instead of a printed circuit board of the second length, at least two printed circuit boards of the first length can be disposed, at a distance from each other, in the equipping section.

An input section is a region of the equipping machine in which printed circuit boards to be equipped can be provided. The input section is disposed next to the equipping section, such that a printed circuit board is transportable from the input section and into the equipping section, in the direction of transport, and thus in the direction of the length of the printed circuit board.

In the transporting of the first printed circuit board of first length out of the input section and into the equipping section, the first printed circuit board is moved in the direction of transport by a transport means, and in this case passes through the buffer region.

In a subsequent step, the first printed circuit board is disposed at the equipping post of the equipping station. The equipping post is the post at which the printed circuit board is disposed during the equipping operation. In the disposing of the printed circuit board at the equipping post, the printed circuit board is preferably positioned with precision in relation to the equipping machine, such that the equipping means of the equipping machine can dispose the electronic components exactly on the printed circuit board, without the need for an elaborate sensor system.

The transporting of the at least one second printed circuit board of first length out of the input section and into the buffer region is preferably effected simultaneously with the transporting of the first printed circuit board of first length out of the buffer region and into the equipping section.

The buffer region is a region of the equipping section in which, in the case of printed circuit boards of the first length, no equipping is effected. Accordingly, in the case of the equipping of printed circuit boards of second length, there is no buffer region, since such printed circuit boards extend substantially over the entire length of the equipping section.

In the releasable fixing of the first printed circuit board to the equipping post, the preferably precisely positioned printed circuit board is fixed relative to the equipping machine, e.g. by means of a clamping device, in order to prevent a relative movement of the printed circuit board in relation to the equipping machine and an associated change of position of the printed circuit board relative to the equipping machine during the equipping operation. Such a change of position may result, for example, in incorrect equipping and/or in damage to the printed circuit board and/or to the electronic components. Alternatively, the first printed circuit board may also be fixed in a releasable manner to the transport device during transport, the transport device being lockable relative to the rest of the equipping machine, such that further fixing to the equipping post, and release of the printed circuit board after the equipping operation and before further transport, are not required in this alternative.

In the transporting of the first printed circuit board out of the equipping section, the first printed circuit board is moved in the direction of transport by the transport means.

The transporting of the second printed circuit board out of the buffer region, to the equipping post, is preferably effected at the same time as the transporting of the first printed circuit board out of the equipping section. In this way, the changeover time is optimized further.

The method according to the invention for equipping printed circuit boards of first length has the advantage, in comparison with known methods, that the changeover time of a conventional equipping machine realized for printed circuit boards of second length can be reduced significantly, since, after the equipping of a first printed circuit board, a second printed circuit board is already disposed next to the equipping post, and consequently only has to be transported a short distance to the equipping post. As a result of this time saving, the production capacity of a conventional equipping machine can be increased without a large amount of effort, such as, for example, conversion measures on the equipping machine, and associated investment costs.

Preferably, a maximum number of second printed circuit boards that can be disposed in the buffer region is determined in dependence on the first length of the second printed circuit boards, a length of the buffer region and a defined distance between adjacent second printed circuit boards in the buffer region, and only so many second printed circuit boards are transported into the buffer region that this maximum number is not exceeded. This has the advantage that a collision of printed circuit boards cannot occur within the equipping section.

Further, it may be provided, in the case of a method according to the invention, that a desired equipping performance of the equipping machine, and a number of second printed circuit boards to be moved into the buffer region, is determined in dependence on the desired equipping performance of the equipping machine and the maximum number of second printed circuit boards that can be disposed in the buffer region, and a corresponding number of second printed circuit boards is transported out of the input section and into the buffer region of the equipping section. A desired equipping performance of the equipping machine is a target quantity of the production capacity of the equipping machine. The desired equipping performance is obtained, for example, from a production performance of further devices, or machines, that are disposed in a production series with the equipping machine. This has the effect, advantageously, that transport of second printed circuit boards into the buffer region is effected only in dependence on an actual requirement of an increase in the production capacity of the equipping machine.

Preferably, at least one of the second printed circuit boards is fixed in a releasable manner in the buffer region. The second printed circuit board is thus secured against a change of position during the equipping of the first printed circuit board. For this purpose, the equipping section has a fixing device such as, for example, a clamping device, which is realized to simultaneously fix printed circuit boards disposed in the equipping section.

Further, preferably, at least one second printed circuit board transported into the buffer region is aligned inside the buffer region, before being transported into the equipping post. This facilitates, or optimizes, subsequent disposing of the second printed circuit board in the equipping post. This can result in a saving of time, and consequently in an increase in the production capacity of the equipping machine. Aligning, in the sense of the invention, is also understood to mean approaching a specific position.

It is preferred that the equipping post be disposed at an end of the equipping section that faces away from the input section. The size of the buffer region is thus maximized. Moreover, the length of a transport path from the equipping post to an output of the equipping machine is thus minimized, such that an equipped second printed circuit board can be transported rapidly out of the equipping section.

According to a preferred further development of a method according to the invention, the equipped first printed circuit board is transported out of the equipping section and into an output section. The output section is preferably realized as part of the equipping machine, and is realized for collecting, or buffering, equipped printed circuit boards.

It is advantageous if the second printed circuit boards are disposed at a distance from each other in the buffer region. In this way, a collision of adjacent printed circuit boards can be prevented, and a process reliability of the equipping machine thus increased further.

Preferably, a presence and/or position of the first printed circuit board and/or of at least one second printed circuit board in the equipping section is monitored and, in the case of absence or an incorrect position of a first printed circuit board and/or second printed circuit board, a corresponding first printed circuit board and/or second printed circuit board is transported into the corresponding post in the equipping station, or the position of the respective first printed circuit board and/or second printed circuit board is corrected. Such a monitoring is preferably performed by means of a sensor, in particular an optical sensor, such that the monitoring can be automated. This has the advantage that an error such as, for example, the absence or an incorrect position of a printed circuit board can be remedied automatically, without this necessarily resulting in a delay in production.

Particularly preferably, in the disposing of the first printed circuit board at the equipping post, the first printed circuit board is conveyed into an operative region of at least one aligning means. An aligning means has, for example, a stop point for the printed circuit board, against which the printed circuit board can be moved. Accordingly, the aligning means is preferably realized as a stop means. The aligning means may also have a sensor such as, for example, a light barrier, by means of which a printed circuit board can be detected and a corresponding signal can be transmitted to a control unit. The control unit is preferably configured such that, upon receiving such a sensor signal, it stops the transport of the sensed printed circuit board.

BRIEF DESCRIPTION OF THE DRAWINGS

Further advantages, features and details of the invention are given by the following description, in which exemplary embodiments of the invention are described in detail with reference to the characters. In this connection, features mentioned in the claims and in the description may be essential to the invention, each individually in itself or in any combination. In the individual figures, elements having the same function and mode of action are denoted by the same references. There are shown schematically in:

FIG. 5 the portion from FIG. 3, at a third instant; and

FIG. 6 the portion from FIG. 3, at a fourth instant.

DESCRIPTION OF EMBODIMENTS

Figure 1:
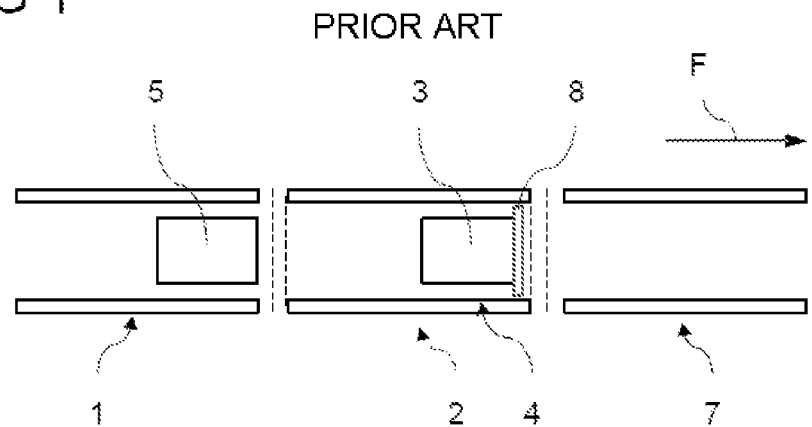
FIG. 1 a portion of a transport system of an equipping machine according to the prior art, at a second instant.

Shown schematically in FIG. 1 is a portion of a transport system according to the prior art, at a second instant. The transport system of the equipping machine has three sections, namely, an input section 1, an equipping section 2 and an output section 7, the equipping section 2 being disposed between the input section 1 and the output section 7. The equipping station 2 has an equipping post 4 adjacent to the output section 7.

At the second instant, the first printed circuit board 3 is disposed at the equipping post 4 and positioned, by means of an aligning means 8, for the purpose of being equipped, and fixed temporarily in this position on the equipping machine. In this exemplary embodiment, the aligning means 8 can be moved, or swiveled, relative to the transport system, in order not to impede further transport of an equipped first printed circuit board 3 into the output section 7. In an alternative embodiment, the aligning means may also be substantially rigid.

A second printed circuit board 5 that follows the first printed circuit board 3 is disposed, into the input section 1, after the first printed circuit board 3 in the direction of conveyance F. It is only after the first printed circuit board 3 has been equipped and transported further, into the output section 7, that the second printed circuit board 5 is transported on to the equipping post 4. This transport path is relatively long in relation to the length of the second printed circuit board 5, such that the transport takes a correspondingly long time and reduces the productivity of the equipping machine.

Figure 2:
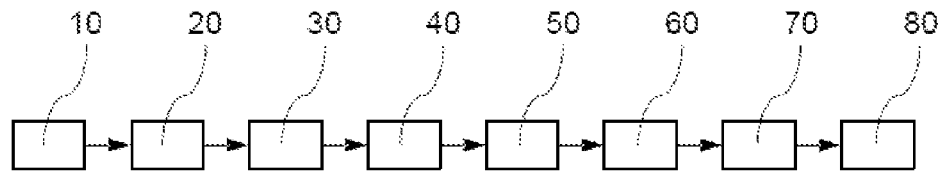
FIG. 2 a sequence diagram of the method according to the invention.

Shown schematically in FIG. 2 is a sequence diagram of the method according to the invention. In the first method step 10, a first printed circuit board 3 of first length is transported out of an input section 1 and into an equipping section 2. In the second method step 20, the first printed circuit board 3 is disposed at an equipping post 4 of the equipping section 2. In the third method step 30, at least one second printed circuit board 5 of first length is transported out of the input section 1 and into a buffer region 6 of the equipping section 2. The buffer region is disposed between the equipping post 4 and the input section 1. In the fourth method step 40, the first printed circuit board 3 is fixed to the equipping post 4 in a releasable manner. In the fifth method step 50, the first printed circuit board 3 is equipped with at least one electronic component 9. In the sixth method step 60, the fixing of the first printed circuit board 3 is released. In the seventh method step 70, the first printed circuit board is transported out of the equipping section 2. In the eighth method step 80, the second printed circuit board 5, which is disposed adjacently to the equipping post 4, is transported out of the buffer region 6 and onto the equipping post 4.

Figure 3:
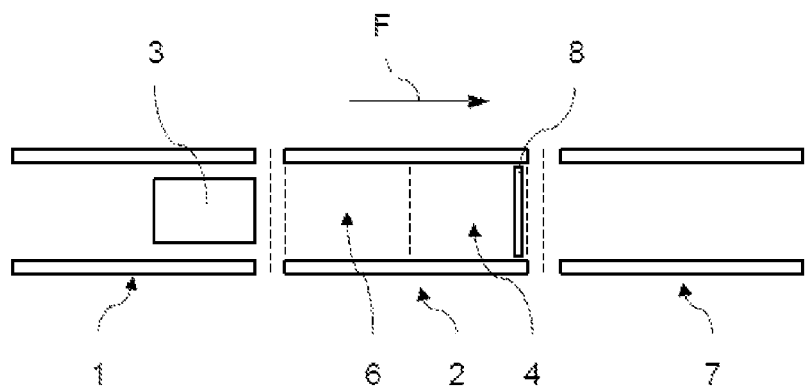
FIG. 3 a portion of a transport system of an equipping machine according to the invention, at a first instant, FIG. 4 a portion from FIG. 3, at a second instant.

FIG. 3 shows a portion of a transport system of an equipping machine at a first instant. The transport system of the equipping machine has three sections, namely, an input section 1, an equipping section 2 and an output section 7, the equipping section 2 being disposed between the input section 1 and the output section 7. The equipping station 2 has an equipping post 4 adjacent to the output section 7, and has a buffer region 6 adjacent to the input section 1. An aligning means 8, which is realized as a sensor, is disposed in the equipping section 2. By means of the sensor, it can be ascertained when a printed circuit board is disposed in the equipping post 4, in order that the printed circuit board can be halted at this position. In this representation, the individual sections are represented merely schematically, and at a distance from each other. It is preferred that the sections be disposed so as to directly adjoin each other in a series.

At the first instant, a first printed circuit board 3 is disposed in the input section 1, and adjacently to the equipping section 2. The first printed circuit board 3 is disposed on a transport means, not represented, and can be moved by means of the latter in the direction of conveyance F, i.e. from the input section 1 in the direction of the equipping section 2. The state of the first instant is an initial state, which occurs, for example, when the equipping machine is put into operation. A further possibility for an initial state is, for example, when a new product is brought into the equipping machine. As operation of the equipping machine progresses, there is normally at least one second printed circuit board 5 in the equipping section 2.

The portion of the transport system from FIG. 3 is represented at a second instant in FIG. 4. At the second instant, the first printed circuit board 3 is disposed at the equipping post 4 and positioned, by means of an aligning means 8, for the purpose of equipping, and fixed temporarily in this position on the equipping machine. The aligning means 8 is realized as a sensor, e.g. as a light barrier. Alternatively, the aligning means 8 can be realized, for example, as an end stop.

The second printed circuit board 5 that follows the first printed circuit board 3 is disposed in the buffer region 6 and is preferably aligned for further transport onto the equipping post 4. Likewise preferably, the second printed circuit board 5 at this instant is fixed temporarily to the equipping machine, in order to prevent an unintended relative movement of the second printed circuit board 5 in relation to the equipping machine. Furthermore, a further second printed circuit board 5 is disposed in the input section 1, and is moved in the direction of the equipping section 2.

The portion of the transport system from FIG. 3 is represented at a third instant in FIG. 5. At the third instant, equipping of the first printed circuit board 3 with electronic components 9 has been completed, and this printed circuit board is no longer fixed to the equipping machine. The aligning means 8 is moved, or swiveled, in such a manner that further transport of the equipped first printed circuit board 3 into the output section 7 is no longer impeded by the aligning means 8. At this instant, the second printed circuit board 5, disposed in the input section 1, is disposed adjacently to the equipping post 2.

The portion of the transport system from FIG. 3 is represented at a fourth instant in FIG. 6. At the fourth instant, the first printed circuit board 3 is moved from the equipping section 2 and into the output section 7, and the second printed circuit board 5, which is following, is moved from the buffer region 6 and onto the equipping post 4. Preferably simultaneously, the second printed circuit board 5 disposed in the input section 1 is moved into the buffer region 6.

In the example represented, the buffer region 6 is of such a size that one second printed circuit board 5 can be disposed in the buffer region 6. In alternative embodiment variants of the method, two, three or more second printed circuit boards 5 can be disposed in the buffer region 6.

LIST OF REFERENCES AND SYMBOLS

1 input section
2 equipping section
3 first printed circuit board
4 equipping post
5 second printed circuit board
6 buffer region
7 output section
8 aligning means
9 electronic component
10 first method step
20 second method step
30 third method step
40 fourth method step
50 fifth method step
60 sixth method step
70 seventh method step
80 eighth method step

The invention claimed is:

1. Method for equipping printed circuit boards on an equipping machine, the printed circuit boards being of a first length, the equipping machine being realized to equip printed circuit boards of a second length, the second length being more than twice as great as the first length, the equipping machine having an input section and an equipping section, the equipping section being disposed after the input section in a direction of conveyance of the printed circuit boards, the printed circuit boards of the first length and the printed circuit boards of the second length being transportable, in their longitudinal direction, from the input section into the equipping station, having the following method steps:

transporting a first printed circuit board of first length out of the input section and into the equipping section;

disposing the first printed circuit board on an equipping post of the equipping section;

transporting at least one second printed circuit board of first length out of the input section and into a buffer region of the equipping section, the buffer region being disposed between the equipping post and the input section;

fixing the first printed circuit board to the equipping post in a releasable manner;

equipping the first printed circuit board;

releasing the fixing of the first printed circuit board;

transporting the first printed circuit board out of the equipping section; and transporting a second printed circuit board, which is disposed adjacently to the equipping post, out of the buffer region and onto the equipping post.

2. Method according to claim 1, wherein a maximum number of second printed circuit boards that can be disposed in the buffer region is determined in dependence on the first length of the second printed circuit boards, a length of the buffer region and a defined distance between adjacent second printed circuit boards in the buffer region, and only so many second printed circuit boards are transported into the buffer region that this maximum number is not exceeded.

3. Method according to claim 2, wherein a desired equipping performance of the equipping machine, and a number of second printed circuit boards to be moved into the buffer region, is determined in dependence on the desired equipping performance of the equipping machine and the maximum number of second printed circuit boards that can be disposed in the buffer region, and a corresponding number of second printed circuit boards is transported out of the input section and into the buffer region of the equipping section.

4. Method according to claim 1, wherein at least one of the second printed circuit boards is fixed in a releasable manner in the buffer region.

5. Method according to claim 1, wherein at least one second printed circuit board transported into the buffer region is aligned inside the buffer region, before being transported into the equipping post.

6. Method according to claim 1, wherein the equipping post is disposed at an end of the equipping section that faces away from the input section.

7. Method according to claim 1, wherein the equipped first printed circuit board is transported out of the equipping section and into an output section.

8. Method according to claim 1, wherein the second printed circuit boards are disposed at a distance from each other in the buffer region.

9. Method according to claim 1, wherein a presence and/or position of the first printed circuit board and/or of at least one second printed circuit board in the equipping section is monitored and, in the case of absence or an incorrect position of a first printed circuit board and/or second printed circuit board, a corresponding first printed circuit board and/or second printed circuit board is transported into the corresponding post in the equipping station, or the position of the respective first printed circuit board and/or second printed circuit board is corrected.

10. Method according to claim 1, wherein in the disposing of the first printed circuit board at the equipping post, the first printed circuit board is conveyed into an operative region of at least one aligning means.

* * * * *